United States Patent [19]

Bergin et al.

[11] 3,885,134

[45] May 20, 1975

[54] BINARY-TO-PERCENT CONVERTER

[75] Inventors: William P. Bergin, Churchville; Charles C. Farmer, North Wales, both of Pa.

[73] Assignee: Honeywell, Inc., Minneapolis. Minn.

[22] Filed: May 22, 1973

[21] Appl. No.: 362,768

[52] U.S. Cl.... 235/92 DM; 235/92 CC; 235/92 PL; 235/156; 235/194; 340/347 DD

[51] Int. Cl. .......... G06f 7/38

[58] Field of Search.......... 340/347 DD, 347 AD, 340/347 NT; 235/156, 154, 194, 92 CC, 92 DM, 92 PL

[56] References Cited

UNITED STATES PATENTS

| | | | |
|---|---|---|---|
| 3,064,889 | 11/1962 | Hupp | 340/347 DD |
| 3,668,691 | 6/1972 | Sergo | 340/347 AD |
| 3,696,398 | 10/1972 | Pomella et al. | 340/347 AD |
| 3,701,145 | 10/1972 | Bergin | 340/347 NT |
| 3,789,390 | 1/1974 | Burkness et al. | 340/347 DD |

*Primary Examiner*—Thomas J. Sloyan
*Attorney, Agent, or Firm*—Arthur H. Swanson; Lockwood D. Burton; Mitchell J. Halista

[57] ABSTRACT

A binary to binary percent converter has a first counter for storing a binary input signal and a clock means generating a clock signal which is selectively applied to the counter means to count down from the binary input signal to a zero store count level. A multiplier circuit is arranged to divide the clock signals supplied to the first counter by a predetermined fraction to convert the clock signal to a percent representation of the binary input signal. The percent representation is stored in a second counter and read out as a binary output signal.

6 Claims, 1 Drawing Figure

PATENTED MAY 20 1975 3,885,134
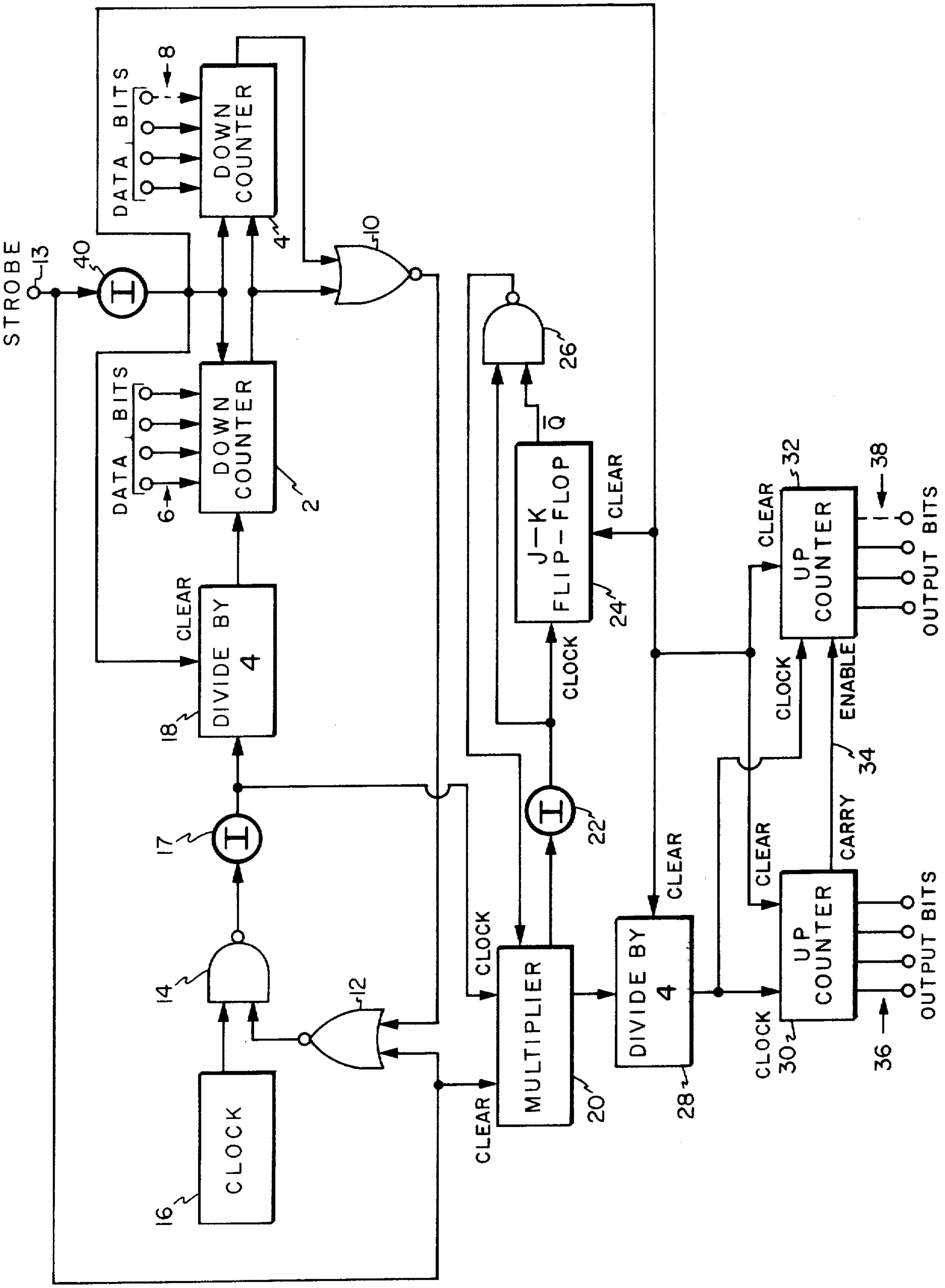

BINARY-TO-PERCENT CONVERTER

BACKGROUND OF THE INVENTION

1. Field of the Invention

The present invention is directed to digital arithmetic circuits. More specifically, the present invention is directed to a binary to binary percent converter circuit.

2. Description of the Prior Art

A basic consideration of digital arithmetic circuits is found in the book "Arithmetic Operations In Digital Computers" by R. K. Richards, Published by D. VanNostrand Co. Inc. in 1955. However, in this publication, there is a lack of a specific circuit for performing a conversion of a binary signal to a percent representation of the binary signal. In many applications involving readout and display of measured data, e.g., in process control, it is desirable to measure deviation, or percent, of the measured variable with respect to a full scale amplitude of the measured variable. Accordingly, a conversion from a binary number representing the measured variable to a percent representation of the binary number is desirable in order to provide an input signal to a system which utilizes the percent representation as a measure of the control to be exercised over the measured variable.

SUMMARY OF THE INVENTION

An object of the present invention is to provide a binary to binary percent converter.

An other object of the present invention is to provide a binary to binary percent converter using digital logic circuits.

In accomplishing these and other objects, there has been provided, in accordance with the present invention, a binary to binary percent converter having a first counter for storing a binary input signal and a selectively gated clock means for supplying clock signals to the counter for counting down from the binary input signal storage signal to a zero store signal level. A multiplier circuit is arranged to multiply the clock signal by a fixed fractional multiplier to provide a binary percent representation of the binary input signal.

BRIEF DESCRIPTION OF THE DRAWING

A better understanding of the present invention may be had when the following detailed description is read in connection with the accompanying drawing in which the single FIGURE is a block diagram of a binary to binary percent converter embodying the present invention.

DESCRIPTION OF THE PREFERRED EMBODIMENT

DETAILED DESCRIPTION

Referring to the single FIGURE drawing in more detail, there is shown a block diagram of a binary to binary percent converter using a pair of counters 2 and 4 for storing input data signal parallel data bits applied to respective sets of input terminals 6 and 8. A separate output signal from each of the counter 2 and 4 is applied to a first NOR gate 10 having an output circuit connected to the input circuit of a second NOR gate 12. A second input signal for the second NOR gate 12 is obtained from a "strobe" input terminal 13 arranged to be connected to a source of synchronizing or "strobe" pulses. An output signal from the second NOR gate 12 is applied as a first input signal to a two-input NAND gate 14. A second input signal for the first NAND gate 14 is obtained from a clock signal generator circuit 16. An output signal from the first NAND gate 14 is applied through a first logical inverter 17 to a first divide-by-four frequency divider circuit 18. An output signal from the divide-by-four circuit 18 is applied to the first counter 2 as a clock signal.

The synchronizing signal from the synchronizing input terminal 13 is also applied as a "clear" signal to a multiplier circuit 20. A first signal for the multiplier 20 is obtained from the output circuit of the inverter circuit 17. A first output signal from the multiplier 20 is applied through a second logical inverter 22 to provide a clock signal for the "clock" input terminal of a J-K flip-flop 24. The logical 0 output from the flip-flop 24 is applied as a first input signal to a second two-input NAND gate 26. A second input signal for the second NAND gate 26 is obtained from the output circuit of the second inverter 22. An output signal from the second NAND gate 26 is applied as a second input signal to the multiplier 20. A second signal from the multiplier 20 is applied to a second divide-by-four circuit 28 while the output signal from the second divide-by-four circuit 28 is applied as an input signal to a second pair of counters 30 and 32. The counters 30 and 32 are interconnected by a "carry" line 34 while their outputs circuits are connected to respective sets of output terminals 36 and 38 a "clear", or reset, signal for the second pair of counters 30 and 32 and the J-K flip-flop 24 is provided by an output signal obtained from a third logical inverter circuit 40 having its input circuit connected to the strobe signal input terminal 13. The "clear" signal from the third inverter 40 is also applied as a "load" signal to the first pair of counters 2 and 4 to enable the storage of the binary input signals from the input terminals 6 and 8 therein.

MODE OF OPERATION

The purpose of the present invention is to convert an N-bit binary input signal applied to the "down" counters 2 and 4 into an N-bit binary percent output signal which is applied to the output terminals 36 and 38. This is done by multiplying the input binary data signal by $100/2^n-1$. For example, a seven bit input signal is multiplied by 100/127. This can be obtained from the fact that for the exemplary seven bit binary input there are 128 logical states however one of these is zero so the maximum count is 127. Accordingly, dividing actual count or bit state stored in the counter 2 and 4 by the maximum count state, or 127, and multiplying by 100 gives the desired percent figure. However, in order to take into account the zero state, a one is added to the maximum count 127 and to the multiplier 100 which gives rise to actual factor of 101/128 which is a closer approximation to the desired 100/127 than 100/128. The multiplier 20, the inverter 22, the flip-flop 24, the NAND gate 26 and the divider 28 convert the clock input pulses as supplied from the output circuit of the first inverter 17 into 101/128 output pulses at the input to the up-counters 30 and 32. The sequence of operation starts with a strobe signal applied to the strobe input terminal 13 from any suitable source as a high level signal. This high level strobe signal is applied as a "load" signal to the "down" counters 2 and 4 to load the input data bits of the seven-bit input signal into the counters 2 and 4. Further, the strobe signal is effective to "clear" the divide-by-four circuits 18 and 28 the multiplier 20 and the J-K flip-flop 24 as well as the "up" counters 30 and 32. Finally, the presence of the strobe signal at the input of the NOR gate 12 is effective to produce an input signal at the input of the NAND gate 14 to block the output signals from the clock 16.

Subsequently, the strobe signal applied to the strobe input terminal 13 is returned to a low level state which low signal level is applied to the NOR gate 12 to produce an output signal from the NOR gate 12 suitable for enabling the NAND gate 14 to allow the clock signals from the clock 16 to pass through the NAND gate 14 to the first logical inverter circuit 17. The output signal from the first inverter circuit 17 is applied through the first divide-by-four circuit 18 to produce an input signal for the "down" counters 2 and 4. Concurrently, this clock signal from the output of the inverter 17 is applied as an input signal to the multiplier circuit 20. The clock signals are applied to the "down" counters 2 and 4 to count down the number loaded into the counters 2 and 4 from the data inputs 6 and 8 until the counters 2 and 4 are empty. At this time a "counter empty" output signal from each of the counters 2 and 4 is applied to the NOR gate 10 which, in turn, produces an output signal to be applied to the NOR gate 12. A resulting output signal from the NOR gate 12 is used to turn off the NAND gate 14.

However, while the clock signal was concurrently being applied to the multiplier 20, the multiplier 20 and its associated circuitry, as mentioned above, were effective to produce the 101/128 clock pulses which are applied to be counted by the "up" counters 30 and 32. When the clock signal is terminated by the counting down of the "down" counters 2 and 4, the number in the "up" counters 30 and 32 appears on the output lines 36 and 38 as the percent equivalent of the data bits supplied to the "down" counters 2 and 4. In other words, the seven bit input binary signal is converted to a seven bit binary signal representing 101/128 times the input binary signal.

The multiplier 20 may be any suitable multiplier circuit such as that manufactured by the Texas Instrument, Inc. of Dallas, Texas and identified as SN 7497. By suitably utilizing such a multiplier circuit, the clock input signal supplied thereto is multiplied by a predetermined fraction to obtain a subdivided clock output signal. In the embodiment disclosed herein, the output signal from the multiplier 20 is arranged to be 50/64 of the clock input signals. However, in order to obtain the desired factor of 101/128, the inverter 22, the flip-flop 24 and the NAND gate 26 are used to insert an additional pulse into the number of pulses out of the multiplier 20 for every other cycle of the multiplier 20. Thus, while an output signal from the multiplier 20 is applied to the logical inverter 22 and, subsequently, to the flip-flop 24 of every cycle of the multiplier, the output signal from the flip-flop 24 is only in a proper state to operate the NAND gate 26 for every other cycle of the flip-flop state requires two output signals from the multiplier 20. Thus, for each to output signals from the multiplier 20 a feedback pulse is generated from the NAND gate 26 and is supplied to the multiplier 20 to inject an additional pulse during each alternate cycle of the multiplier 20 to give an output of 51/64 times the number of clock pulses applied to the multiplier 20. Since the divide-by-four circuit 28 is arranged to accumulate, or average, the output signals derived fromt the operation of the multiplier 20, two of the cycles of the multiplier 20 produce 100/128 times the number of multiplier input pulses while the other two cycles produce 102/128 times the number of multiplier input pulses which gives an average output from the divide-by-four circuit 28 of 101/128 times the number of multiplier input clock pulses to be applied to the "up" counters 30 and 32. Consequently, when the output pulses from the divide-by-four circuit 28 are stored in the up counters 30 and 32, the binary output signals appearing on the counter output lines 36 and 38 represent the percent of the input binary data bits supplied to the input terminals 6 and 8. The operation of each cycle of the multiplier 20 is related to the overall operation of the circuit of the present invention starting with the application of a strobe pulse to the strobe input terminal 13 as described above with four overall cycles of the circuitry being used by the multiplier 20 to produce the percent conversion of the binary input data on the input terminals 6 and 8.

Accordingly, it may be seen, that there has been provided, in accordance with the present invention, a binary to binary percent converter circuit for converting a binary input signal into a binary output signal which is a percent representation of the input signal.

The embodiments of the invention in which an exclusive property or privilege is claimed are defined as follows:

1. A converter circuit comprising:

a counter means for storing an input data signal and responsive to a clock signal for counting from said data signal to a predetermined count, clock signal generating means, gate means connected between said clock signal generating means and said counter means to apply clock signals from said clock signal generating means to said counter means until said predetermined count is reached in said counter means, multiplier means for multiplying an input signal to said multiplier means by a predetermined factor, and means for applying said clock signals from said gate means as an input signal to said multiplier means to be multiplied by said predetermined factor to produce an output signal from said multiplier means having a predetermined relationship with respect to said input data signal to said counter means, said predetermined factor used by said multiplier means being $50/2^{n-1}$ where $n$ is the number of bits in the input signal and said multiplier means including pulse adding means for adding one pulse for every other multiplication cycle of said multiplier means and averaging means for averaging four cycles of said multiplier means to produce an average multipling factor of $101/2^n$.

2. A converter circuit as set forth on claim 1 wherein said multiplier means includes a second counter means for storing said output signal from said multiplier means.

3. A converter circuit as set forth in claim 2 wherein said input signal to said first-mentioned counter means is a binary signal and an output signal from said second counter means in said multiplier circuit is a binary signal.

4. A converter circuit as set forth in claim 2 wherein said first-mentioned counter means is a seven bit binary counter and said input signal to said first-mentioned counter means is a seven bit binary signal and said output signal from said second counter circuit in said multiplier means is a binary signal and said multiplier circuit is arranged to multiply said binary input signal by a factor of 101/128.

5. A converter circuit as set forth in claim 1 wherein said gate means includes means responsive to a zero count level stored in said counter means to block said clock signals from said counter means.

6. A converter circuit as set forth in claim 1 wherein said data input signal is a seven bit binary signal and the predetermined factor used by said multiplier circuit is 50/6 4 and said factor is 101/128.

* * * * *